United States Patent
Gao et al.

(10) Patent No.: US 9,804,613 B2
(45) Date of Patent: Oct. 31, 2017

(54) PARALLEL TRANSISTOR CIRCUIT CONTROLLER

(71) Applicant: The Boeing Company, Chicago, IL (US)

(72) Inventors: Lijun Gao, Kent, WA (US); Shengyi Liu, Sammamish, WA (US); Eugene V. Solodovnik, Lake Stevens, WA (US); Kamiar J. Karimi, Kirkland, WA (US)

(73) Assignee: THE BOEING COMPANY, Chicago, IL (US)

( * ) Notice: Subject to any disclaimer, the term of this patent is extended or adjusted under 35 U.S.C. 154(b) by 1091 days.

(21) Appl. No.: 13/947,286

(22) Filed: Jul. 22, 2013

(65) Prior Publication Data

US 2015/0022245 A1 Jan. 22, 2015

(51) Int. Cl.
| | |
|---|---|
| G05F 1/46 | (2006.01) |
| H02M 1/088 | (2006.01) |
| H02M 3/158 | (2006.01) |
| H02M 7/493 | (2007.01) |
| H03K 17/12 | (2006.01) |
| H02M 1/00 | (2006.01) |

(52) U.S. Cl.
CPC ............ G05F 1/462 (2013.01); H02M 1/088 (2013.01); H02M 3/1584 (2013.01); H02M 7/493 (2013.01); H03K 17/12 (2013.01); H02M 2001/0009 (2013.01)

(58) Field of Classification Search
CPC ............. Y10T 307/406; Y10T 307/414; Y10T 307/422; Y10T 307/43; Y10T 307/438; H02M 3/1584

USPC ...................................................... 307/31–35
See application file for complete search history.

(56) References Cited

U.S. PATENT DOCUMENTS

| | | | | |
|---|---|---|---|---|
| 3,254,302 A | * | 5/1966 | Boykin ................... | H03F 3/211 307/32 |
| 3,675,114 A | * | 7/1972 | Nercessian ........... | G05F 1/5735 307/32 |
| 4,461,690 A | * | 7/1984 | Rolff ....................... | G05F 1/561 204/228.1 |
| 4,616,142 A | * | 10/1986 | Upadhyay .............. | H03K 17/12 323/272 |
| 4,717,833 A | * | 1/1988 | Small ....................... | G05F 1/59 307/44 |
| 4,877,972 A | * | 10/1989 | Sobhani ................... | G05F 1/59 307/34 |

(Continued)

FOREIGN PATENT DOCUMENTS

| | | |
|---|---|---|
| EP | 1320167 | 6/2003 |
| EP | 2445110 A1 | 4/2012 |
| WO | WO2005015741 A2 | 2/2005 |

OTHER PUBLICATIONS

Loop Gain Measurement of Paralleled DC-DC Converters with Average-Current-Sharing Control, Panov et al., IEEE, Nov. 2008.*

(Continued)

*Primary Examiner* — Fritz M Fleming
(74) *Attorney, Agent, or Firm* — Yee & Associates, P.C.

(57) ABSTRACT

A method for controlling a circuit control system. Currents are sensed at outputs of transistors in the circuit control system. Levels are identified for the currents. A number of characteristics of the transistors are controlled while the currents flow out of the transistors such that the currents flowing out of the transistors have desired levels.

20 Claims, 12 Drawing Sheets

(56) References Cited

U.S. PATENT DOCUMENTS

| | | | | |
|---|---|---|---|---|
| 5,208,485 A | * | 5/1993 | Krinsky | G05F 1/577 |
| | | | | 307/34 |
| 5,592,394 A | * | 1/1997 | Wiscombe | H02J 1/10 |
| | | | | 307/31 |
| 5,889,663 A | | 3/1999 | Tabata et al. | |
| 6,278,263 B1 | * | 8/2001 | Walters | H02M 3/1584 |
| | | | | 323/272 |
| 6,534,960 B1 | * | 3/2003 | Wells | H02M 3/1584 |
| | | | | 323/222 |
| 8,373,304 B2 | | 2/2013 | Chang et al. | |
| 8,432,104 B2 | | 4/2013 | Hu et al. | |
| 9,046,912 B1 | * | 6/2015 | Liu | G05F 1/625 |
| 2003/0214354 A1 | * | 11/2003 | Chen | H02M 3/1584 |
| | | | | 330/124 D |
| 2007/0200538 A1 | * | 8/2007 | Tang | H02M 3/157 |
| | | | | 323/237 |

OTHER PUBLICATIONS

Extended European Search Report, dated Dec. 3, 2014, regarding Application No. EP14172775.0, 11 pages.

Bortis et al., "Active Gate Control for Current Balancing of Parallel-Connected IGBT Modules in Solid-State Modulators," IEEE Transactions on Plasma Science, vol. 36, No. 5, Oct. 2008, pp. 2632-2637.

Hofer et al., "Paralleling intelligent IGBT power modules with active gate-controlled current balancing," PESC Record: Annual IEEE Power Electronics Specialists Conferences, Jun. 1996, pp. 1312-1316.

* cited by examiner

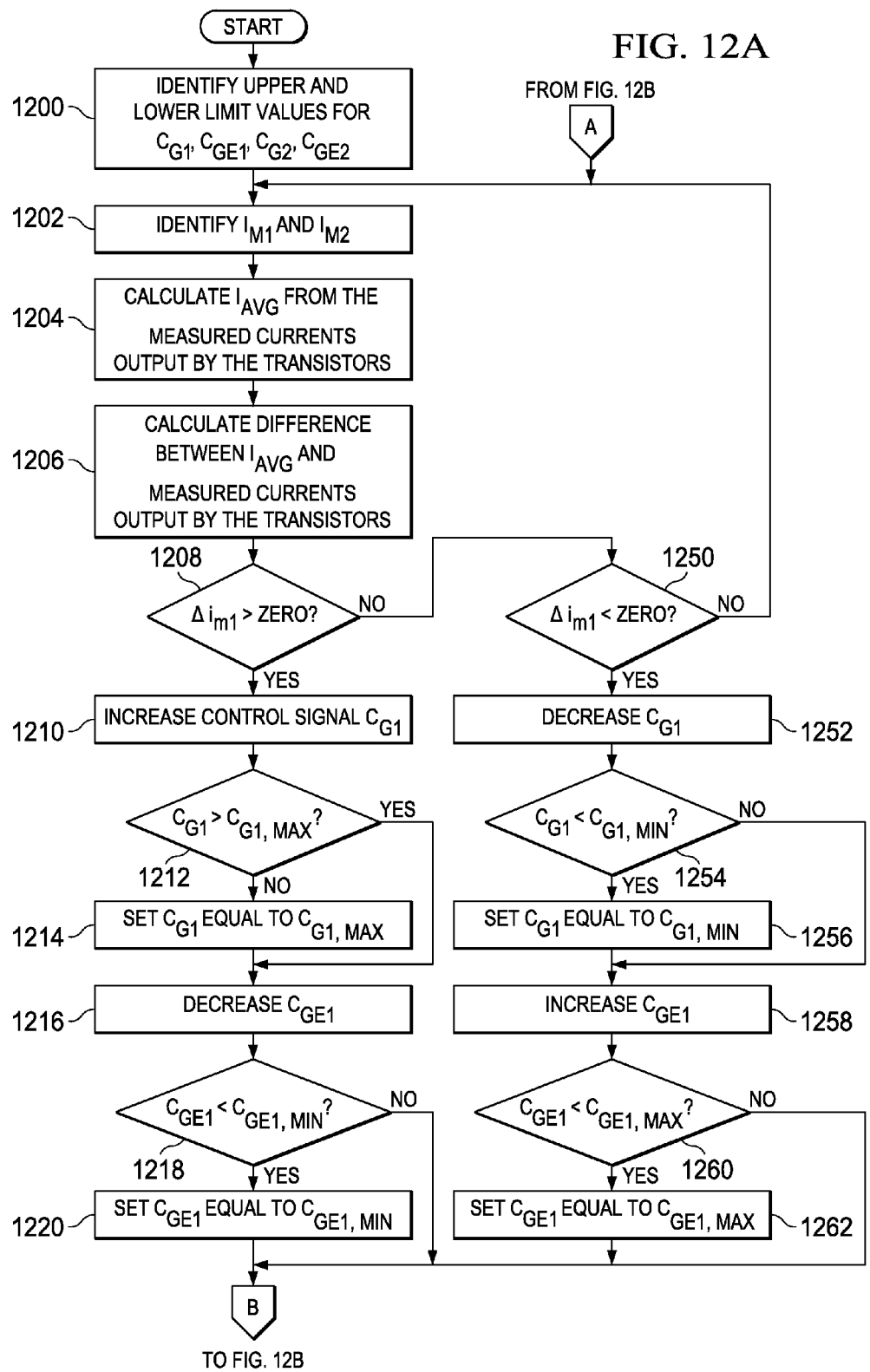

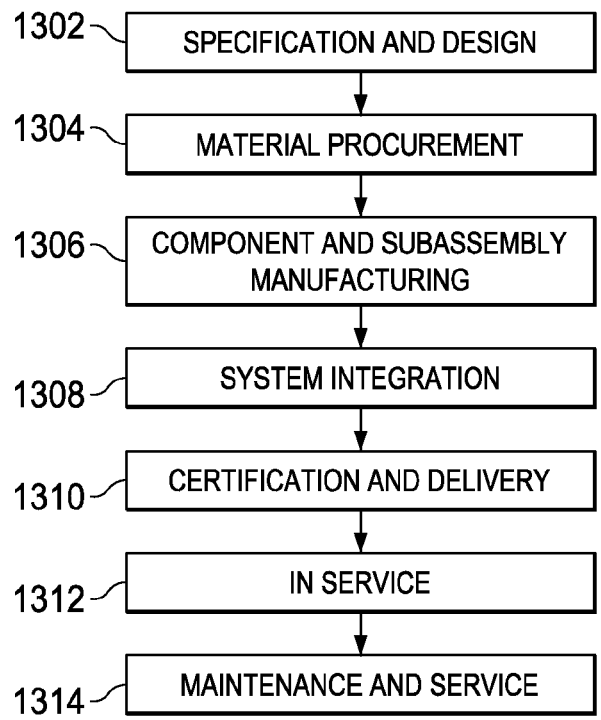
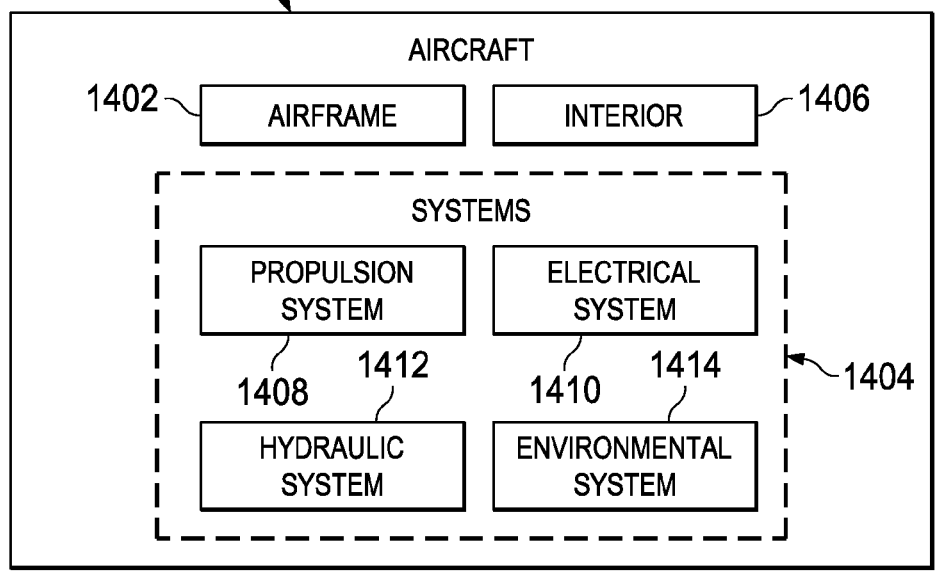

PARALLEL TRANSISTOR CIRCUIT CONTROLLER

BACKGROUND INFORMATION

1. Field

The present disclosure relates generally to circuits and, in particular, to circuits with transistors. Still more particularly, the present disclosure relates to a method and apparatus for controlling the operation of circuits with transistors.

2. Background

A circuit module is comprised of one or more electronic components. These components may be, for example, resistors, transistors, capacitors, inductors, diodes, or other components that may be connected to each other through wires or traces. A circuit module may also be referred to as an electronic circuit.

Although circuit modules may be formed from discrete components connected to each other by wires, electronic circuits are more commonly formed on a printed circuit board or on a semiconductor as an integrated circuit.

Circuit modules are used for many different purposes. For example, circuit modules may be used in power applications. For example, circuit modules may be used to convert direct current to alternating current, alternating current to direct current, and from direct current to direct current as examples of some uses. These types of circuit modules may be used to provide power to other electronic circuits for devices.

In some cases, a circuit module that provides current to power other circuits may not be configured to a desired level of current. With this situation, another circuit module may be used that provides a higher level of current. Another solution may involve connecting two or more circuit modules in parallel to provide the desired level of current.

Operating circuit modules in parallel to provide a desired level of current may be challenging depending on the precision desired for the current level generated by the circuit modules. The differences in current generated may be caused by the variation in values for parameters in manufacturing the circuit modules. These parameters represent electrical properties for the components in the circuit modules.

With unbalanced current sharing, undesirable results may occur. For example, unbalanced sharing by electronic modules may result in at least one of overheating, a presence of circulation currents, damage to transistors, increase losses, de-rating of the circuit modules, or other undesirable results.

Design constraints may be used in an attempt to reduce variations in values for parameters. These design constraints may include matching components. For example, a common gate drive circuit may be used to parallel connected transistors. Separate gate drive circuits may be used that are very closely matched. Closely matched gate drive resistors may be used. Homogenous sinks may be used to cure parallel circuit modules to reduce temperature differences between circuit modules. Closely matched transistors may be used in constructing circuit modules. Common mode chokes may be used in the gate drive circuit and the rewiring impedance for transistors may be reduced.

These and other design constraints may be used in an attempt to reduce the variations in parameters during the operation of a circuit module. These types of constraints, however, may not be able to reduce the variations in values for parameters as much as desired.

Therefore, it would be desirable to have a method and apparatus that take into account at least some of the issues discussed above, as well as other possible issues.

SUMMARY

In one illustrative embodiment, an apparatus comprises a controller. The controller is configured to identify currents flowing out of transistors and control a number of characteristics of the transistors while the currents flow out of the transistors such that the currents flowing out of the transistors have desired levels.

In another illustrative embodiment, a circuit control system comprises a number of circuit modules, variable resistance devices, a current sensor system, and a controller. The number of circuit modules includes transistors connected in parallel. The variable resistance devices are connected to control terminals of the transistors. The current sensor system is configured to sense currents at outputs of the transistors. The controller is configured to identify levels of the currents flowing out of transistors from the current sensor system and control a number of characteristics of the transistors using the variable resistance devices while the currents flow out of the transistors such that the currents flowing out of the transistors have desired levels.

In yet another illustrative embodiment, a method for controlling a circuit control system is presented. Currents are sensed at outputs of transistors in the circuit control system. Levels are identified for the currents. A number of characteristics of the transistors are controlled while the currents flow out of the transistors such that the currents flowing out of the transistors have desired levels.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIGS. 12A and 12B are illustrations of a flowchart of a process for controlling the operation of transistors in a circuit control system in accordance with an illustrative embodiment;

FIG. 13 is an illustration of an aircraft manufacturing and service method in the form of a block diagram in accordance with an illustrative embodiment; and FIG. 14 is an illustration of an aircraft in the form of a block diagram in which an illustrative embodiment may be implemented.

DETAILED DESCRIPTION

The illustrative embodiments recognize and take into account one or more considerations. For example, illustrative embodiments recognize and take into account that circuit modules connected in parallel operate in a steady state or dynamic conditions to generate current. The circuit modules operate by current sharing in which each module delivers a "share" of the current.

This type of current generation may be affected by the values for parameters for components in the circuit modules. For example, differences in values for parameters for transistors may affect the current that is generated by the circuit modules.

The illustrative embodiments recognize and take into account that efforts may be made to manufacture the transistors with matching values for parameters. However, statistical variations in manufacturing processes may result in an inability to provide a desired level of matching for the values. For example, variations in manufacturing circuit modules may result in an inability to have a desired level of matching between components in the circuit modules such as transistors. These variations also may result in gate drive circuits being unable to apply the same voltages and currents to gates or other types of control terminals in the transistors in circuit modules.

Further, the illustrative embodiments recognize and take into account that even if values for parameters are matched as closely as desired, operating conditions may affect different modules differently. For example, different transistors may heat differently. As a result, although values for parameters may initially be substantially the same, differences in the temperatures for the transistors may result in the values being different during operation of the transistors.

As a result, the currently used solutions of matching parameters may not be as effective as desired for current sharing. Differences in manufacturing processes and in-situ operation environment conditions may result in the values for parameters for gate drive circuits, transistors, and other components in circuit modules being greater than desired. These differences result in unequal current sharing.

The illustrative embodiments recognize and take into account that managing the characteristics of the transistors during operation of the transistors in the circuit modules may provide a desired result in generating current even when the values for parameters are unable to provide the desired result.

The illustrative embodiments provide a method and apparatus for managing the operation of transistors. In one illustrative embodiment, an apparatus comprises a controller. The controller is configured to identify currents flowing out of transistors and control a number of characteristics of the transistors while the currents flow out of the transistors such that the currents flowing out of the transistors have desired levels.

Figure 1:
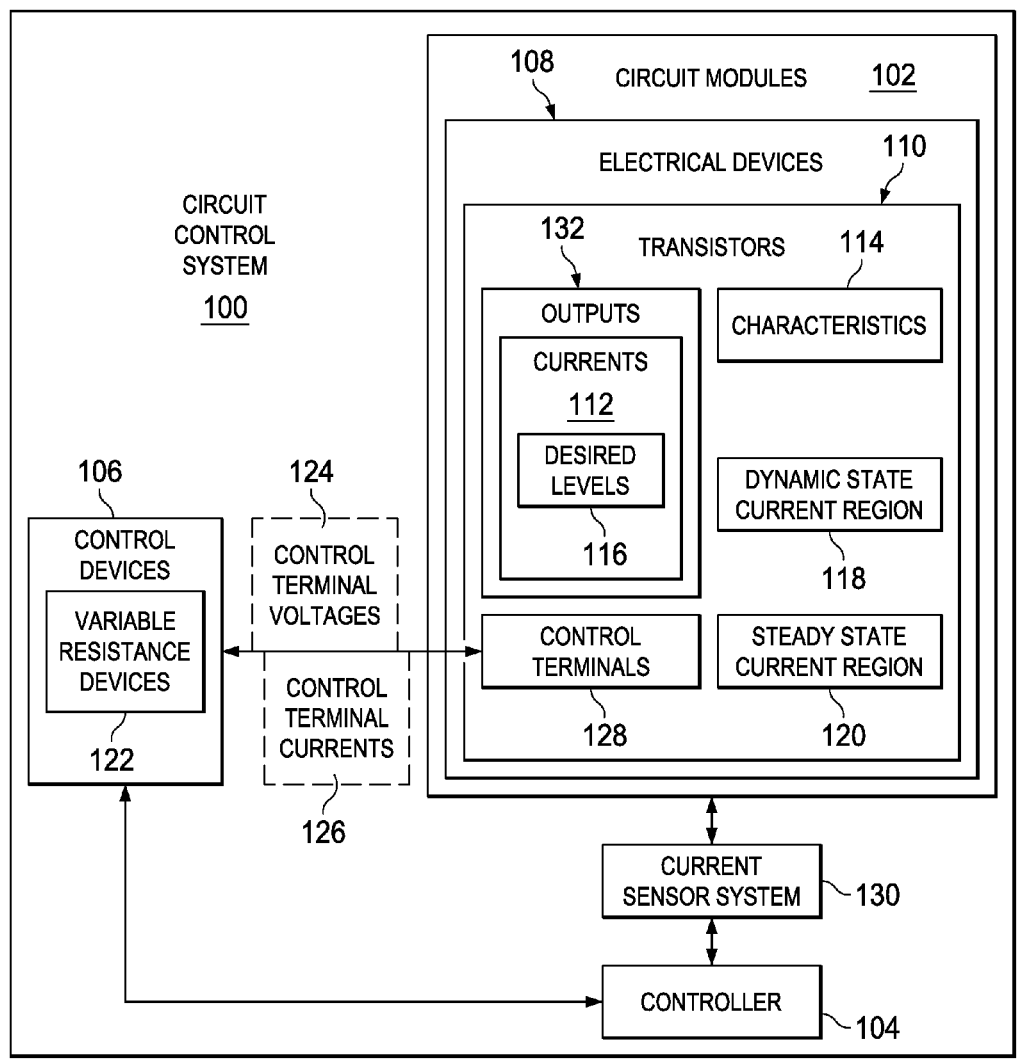
FIG. 1 is an illustration of a block diagram of a circuit control system in accordance with an illustrative embodiment.

With reference now to the figures and, in particular, with reference to FIG. 1, an illustration of a block diagram of a circuit control system is depicted in accordance with an illustrative embodiment. Circuit control system 100 includes circuit modules 102, controller 104, and control devices 106.

As depicted, circuit modules 102 are comprised of electrical devices 108. In particular, electrical devices 108 include transistors 110. A transistor in transistors 110 is a semiconductor device. The transistor has at least 3 terminals.

In the illustrative example, a current may flow into a first terminal and out of a second terminal. The flow of the current is controlled by a control terminal. For example when the transistor is a field-effect transistor, the first terminal is a drain and the second terminal is a source. The control terminal is a gate. If the transistor is a bipolar junction transistor, the first terminal is the collector, the second terminal is the emitter, and the control terminal is the base.

A number of circuit modules 102 is selected from at least one of a power module, an inverter, a direct current to direct current converter, an alternating current to direct current converter, or some other suitable circuit module. A "number of," when used with reference to items, means one or more items. For example, a number of circuit modules is one or more circuit modules.

As used herein, the phrase "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A, one of item B, and ten of item C; four of item B and seven of item C; and other suitable combinations. The item may be a particular object, thing, or a category. In other words, at least one of means any combination of items and number of items may be used from the list but not all of the items in the list are required.

In the illustrative example, a portion of transistors 110 may be connected in parallel. A portion of circuit modules 102 also may be connected in parallel. The portion may be some or all of at least one of transistors 110 or circuit modules 102. This configuration may result in current sharing by the portion of transistors 110, the portion of circuit modules 102, or both.

Controller 104 is configured to identify currents 112 flowing out of transistors 110 in a number of circuit modules 102. Controller 104 may be implemented in software, hardware, firmware or a combination thereof. When software is used, the operations performed by controller 104 may be implemented in program code configured to run on a processor unit. When firmware is used, the operations performed by controller 104 may be implemented in program code and data and stored in persistent memory to run on a processor unit. When hardware is employed, the hardware may include circuits that operate to perform the operations in controller 104.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and/or may be comprised entirely of organic components excluding a human being. For example, the processes may be implemented as circuits in organic semiconductors.

In the illustrative example, currents 112 may be identified using current sensor system 130. For example, current sensor system 130 may sense currents 112 at outputs 132 of transistors 110.

As depicted, current sensor system 130 may be implemented using one or more different types of devices. As depicted, current sensor system 130 may include a current transformer configured to connect to outputs 132 of two or more of transistors 110 and configured to indicate a difference between currents 112 flowing out of those transistors. Outputs 132 may be a drain for a field effect transistor, an emitter for a bipolar junction transistor, or other outputs for other types of transistors. Other examples of current sensors include a resistor, a Hall effect current sensor, a fiber optic current sensor, a current claim, a current probe, and other suitable types of current sensors.

Controller 104 is also configured to control a number of characteristics 114 of transistors 110 while currents 112 flow out of transistors 110 such that currents 112 flowing out of transistors 110 have desired levels 116. In the illustrative example, currents 112 flowing from transistors 110 are used as a feedback to identify values for number of characteristics 114.

Values for one or more of the number of characteristics 114 may be identified based on the level of currents 112. In the illustrative example, values for the number of characteristics 114 that may be identified by controller 104 are selected from at least one of a voltage for a gate of a transistor in the transistors, a current applied to the gate, or some other suitable characteristic of transistors 110 that may affect the flow of currents 112.

In the illustrative example, values for the number of characteristics 114 are identified for at least one of dynamic state current region 118 or steady state current region 120 for transistors 110. In this illustrative example, dynamic state current region 118 is present for a transistor in transistors 110 when a current is supplied to the gate of the transistor. The current is different from currents 112. Steady state current region 120 is present when the current does not need to be supplied to the gate of the transistor.

As depicted, control devices 106 include variable resistance devices 122. Controller 104 is configured to control control devices 106. In particular, controller 104 is configured to control variable resistance devices 122 in controlling the number of characteristics while currents 112 flow out of transistors 110 such that currents 112 flowing out of transistors 110 have desired levels 116.

In the illustrative example, a number of variable resistance devices 122 in control devices 106 control at least one of control terminal voltages 124 or control terminal currents 126 applied to control terminals 128 of transistors 110. When transistors 110 are field effect transistors, control terminal voltages 124 are gate voltages and control terminal currents 126 are gate currents applied to control terminals 128 in the form of gates.

The number of variable resistance devices 122 may be implemented using one or more different types of devices. For example, the number of variable resistance devices 122 may be selected from at least one of a variable resistor, a current controlled variable resistance device, an optical controlled variable resistance device, a transistor, a bipolar junction transistor (BJT), a field effect transistor (FET), a metal-oxide semiconductor field effect transistor (MOSFET), an insulated gate bipolar transistor (IGBT), or some other suitable device.

The illustration of circuit control system 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, one or more controllers in addition to controller 104 may be present in circuit control system 100 to control characteristics 114 of transistors 110. Further, transistors 110 may be of the same type or different types. Also, the parameters for transistors may be selected to be as close as possible to each other or may be selected to have different values depending on the implementation.

As another example, control devices 106 and current sensor system 130 are shown as separate blocks from circuit modules 102. In some illustrative examples, control devices 106, current sensor system 130, or both may be located or considered part of circuit modules 102.

Figure 2:
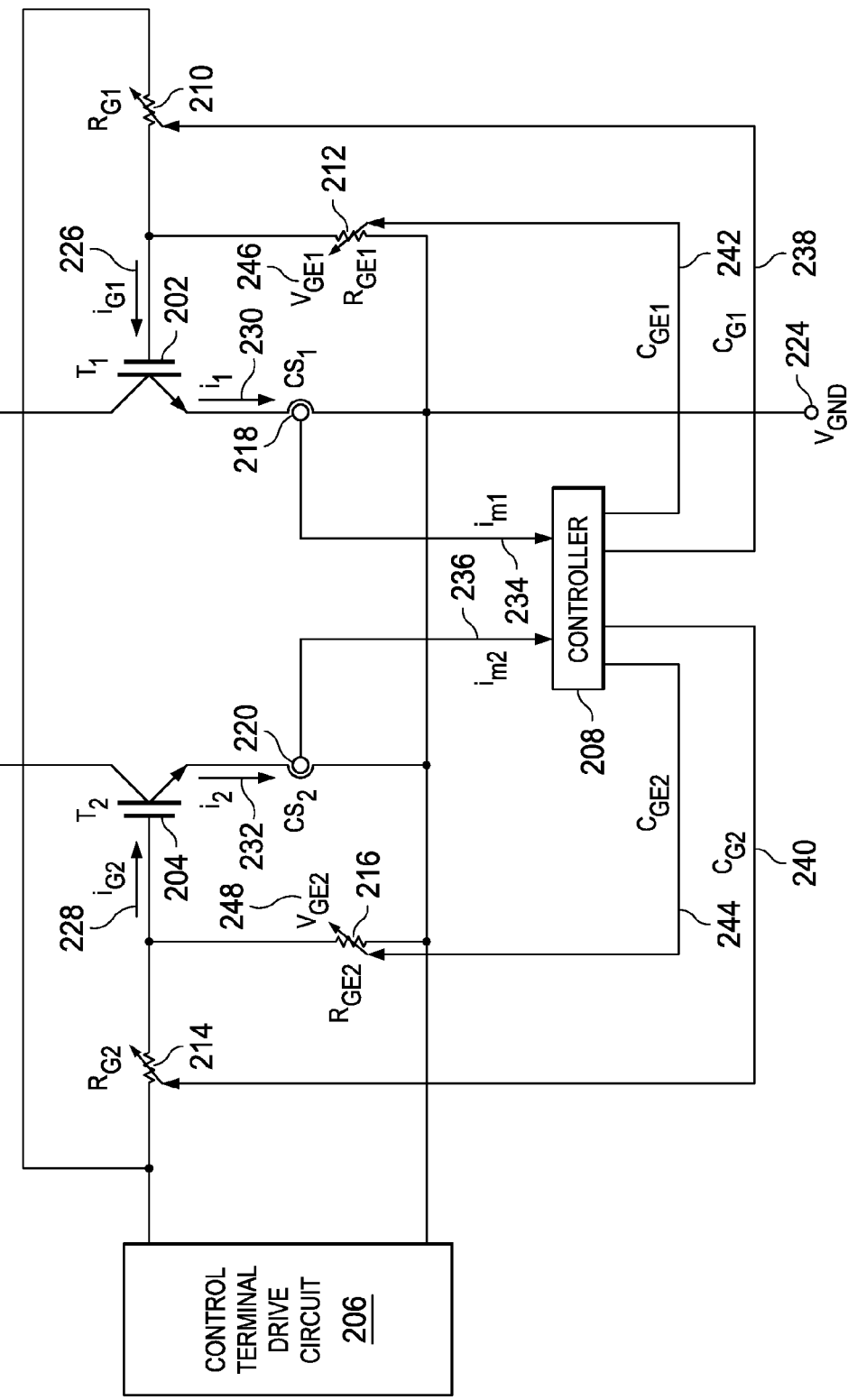
FIG. 2 is an illustration of a schematic diagram of a circuit control system in accordance with an illustrative embodiment.

Turning next to FIG. 2, an illustration of a schematic diagram of a circuit control system is depicted in accordance with an illustrative embodiment. Circuit control system 200 is an example of an implementation of circuit control system 100 shown in block form in FIG. 1.

In this illustrative example, circuit control system 200 includes a number of different components. As depicted, circuit control system 200 includes transistor $t_1$ 202, transistor $t_2$ 204, control terminal drive circuit 206, controller 208, variable resistance device $R_{G1}$ 210, variable resistance device $R_{GE1}$ 212, variable resistance device $R_{G2}$ 214, variable resistance device $R_{GE2}$ 216, current sensor $CS_1$ 218, and current sensor $CS_2$ 220.

As depicted, transistor $t_1$ 202 and transistor $t_2$ 204 are bipolar junction transistors. These two transistors are connected in parallel. Transistor $t_1$ 202 and transistor $t_2$ 204 are examples of transistors 110 shown in block form in FIG. 1. The collectors of transistor $t_1$ 202 and transistor $t_2$ 204 are connected to voltage $V_{DC}$ 222. The emitter of transistor t1 202 is connected to voltage $V_{GND}$ 224 through current sensor $CS_1$ 218. The emitter of transistor $t_2$ 204 is connected to voltage $V_{GND}$ 224 through current sensor $CS_2$ 220.

The base of transistor t1 202 and the base of transistor $t_2$ 204 are control terminals in this illustrative example. The base of transistor $t_1$ 202 is connected to variable resistance device $R_{G1}$ 210 and variable resistance device $R_{GE1}$ 212.

The base of transistor $t_2$ 204 is connected to variable resistance device $R_{G2}$ 214 and variable resistance device $R_{GE2}$ 216.

In these illustrative examples, variable resistance device $R_{G1}$ 210, variable resistance device $R_{GE1}$ 212, variable resistance device $R_{G2}$ 214, and variable resistance device $R_{GE2}$ 216 are examples of implementations for variable resistance devices 122 shown in block form in FIG. 1 and are connected to control terminal drive circuit 206. Control terminal drive circuit 206 is configured to supply current $i_{G1}$ 226 and current $i_{G2}$ 228. Current $i_{G1}$ 226 is sent to transistor $t_1$ 202 while current $i_{G2}$ 228 is sent to transistor $t_2$ 204. The values of resistance for variable resistance device $R_{G1}$ 210, variable resistance device $R_{GE1}$ 212, variable resistance device $R_{G2}$ 214, and variable resistance device $R_{GE2}$ 216 are controllable by controller 208 in the illustrative example.

As depicted, current $i_1$ 230 flows out of transistor $t_1$ 202 and current $i_2$ 232 flows out of transistor $t_2$ 204. These two currents are combined for current sharing by transistor $t_1$ 202 and transistor $t_2$ 204 in this illustrative example. Current $i_1$ 230 is sensed by current sensor $CS_1$ 218, and current $i_2$ 232 is sensed by current sensor $CS_2$ 220. Current sensor $CS_1$ 218 and current sensor $CS_2$ 220 are examples of components that may be used to implement current sensor system 130 shown in block form in FIG. 1.

Controller 208 is configured to identify the levels for current $i_1$ 230 and current $i_2$ 232 using current $i_{m1}$ 234 and current $i_{m2}$ 236 received from current sensor $C_{S1}$ 218 and current sensor $C_{S2}$ 220, respectively. The levels of current $i_{m1}$ 234 and current $i_{m2}$ 236 correspond to the values for current $i_1$ 230 and current $i_2$ 232. The levels of current $i_{m1}$ 234 and current $i_{m2}$ 236 are used as a feedback to control the characteristics of transistor $t_1$ 202 and transistor $t_2$ 204 using variable resistance device $R_{G1}$ 210, variable resistance device $R_{GE1}$ 212, variable resistance device $R_{G2}$ 214, and variable resistance device $R_{GE2}$ 216.

In this illustrative example, controller 208 identifies an average for current $i_1$ 230 and current $i_2$ 232 indirectly through current $i_{m1}$ 234 and current $i_{m2}$ 236. Additionally, a difference between current $i_{m1}$ 234 and current $i_{m2}$ 236 and the average current is used to generate outputs to control the variable resistance devices.

As depicted, controller 208 generates control signal $C_{G1}$ 238, control signal $C_{G2}$ 240, control signal $C_{GE1}$ 242, and control signal $C_{GE2}$ 244 to control the values for variable resistance device $R_{G1}$ 210, variable resistance device $R_{GE1}$ 212, variable resistance device $R_{G2}$ 214, and variable resistance device $R_{GE2}$ 216, respectively. These signals are analog signals in this example. In other implementations, the control signals may be digital signals if the variable resistance devices are digitally controlled.

These outputs from controller 208 function as control signals to adjust the resistances for the variable resistance devices. For example, control signal $C_{G1}$ 238 controls the value of variable resistance device $R_{G1}$ 210, which may be used to control gate current $i_{G1}$ 226. Control signal $C_{GE1}$ 242 may be used to control the value of variable resistance device $R_{GE1}$ 212, which may be used to set voltage $V_{ge1}$ 246 across variable resistance device $R_{GE1}$ 212. Setting this voltage also sets the voltage for the base of transistor $t_1$ 202.

As depicted, current $i_{G1}$ 226 and current $i_{G2}$ 228 may be set to be substantially equal to each other such that transistor $t_1$ 202 and transistor $t_2$ 204 output current $i_1$ 230 and current $i_2$ 232 at substantially the same levels. The control of current $i_{G1}$ 226 and current $i_{G2}$ 228 may occur while transistor $t_1$ 202 and transistor $t_2$ 204 are in a dynamic current region.

In a similar fashion, control signal $C_{G2}$ 240 controls the value of variable resistance device $R_{G2}$ 214, which may be used to control current $i_{G2}$ 228. Control signal $C_{GE2}$ 244 may be used to control the value of variable resistance device $R_{GE2}$ 216, which may be used to set voltage $V_{ge2}$ 248 across variable resistance device $R_{GE2}$ 216. Setting this voltage also sets the voltage for the base of transistor $t_2$ 204.

In these illustrative examples, voltage $V_{ge1}$ 246 and voltage $V_{ge2}$ 248 may be set to be substantially equal to each other as part of causing transistor $t_1$ 202 and transistor $t_2$ 204 to output current $i_1$ 230 and current $i_2$ 232 with substantially the same levels. The control of voltage $V_{ge1}$ 246 and voltage $V_{ge2}$ 248 may occur while the transistors are in a dynamic state current region, a steady state current region, or both.

Figure 3:
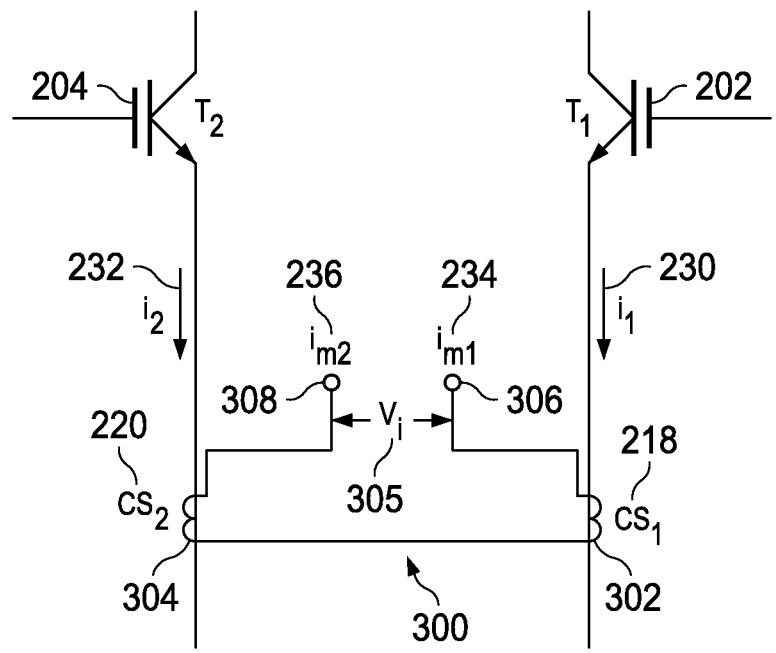
FIG. 3 is an illustration of an implementation for current sensors in accordance with an illustrative embodiment.

FIG. 3 is an illustration of an implementation for current sensors in accordance with an illustrative embodiment. Transformer 300 is an example of an implementation for current sensor $CS_1$ 218 and current sensor $CS_2$ 220 as depicted in FIG. 2. In this illustrative example, transformer 300 includes inductor 302 and inductor 304. Inductor 302 corresponds to current sensor $CS_1$ 218 and inductor 304 corresponds to current sensor $CS_2$ 220.

In this illustrative example, transformer 300 is configured to sense current $i_{m1}$ 234 and current $i_{m2}$ 236 in FIG. 2. In this illustrative example, the relative value of current $i_{m1}$ 234 and current $i_{m2}$ 236 may be identified as voltage $V_1$ 305 across terminal 306 and terminal 308 of transformer 300. Voltage $V_1$ 305 represents a difference between current $i_{m1}$ 234 and current $i_{m2}$ 236.

Figure 4:
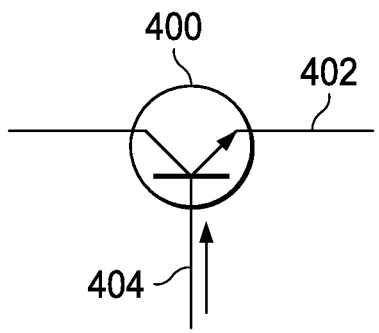
FIG. 4 is an illustration of an implementation for a variable resistance device in accordance with an illustrative embodiment.

With reference now to FIG. 4, an illustration of an implementation for a variable resistance device is depicted in accordance with an illustrative embodiment. As depicted, bipolar junction transistor 400 is an example of a variable resistance device that may be used to implement in variable resistance device $R_{G2}$ 214 in FIG. 2.

As can be seen, current $i_{G2}$ 228 may flow out of emitter 402 of bipolar junction transistor 400. Base 404 of bipolar junction transistor 400 is controlled by control signal $C_{G2}$ 240 from controller 208 in FIG. 2. Other variable resistance devices also may be implemented using a bipolar junction transistor similar to bipolar junction transistor 400 in the illustrative example.

Figure 5:
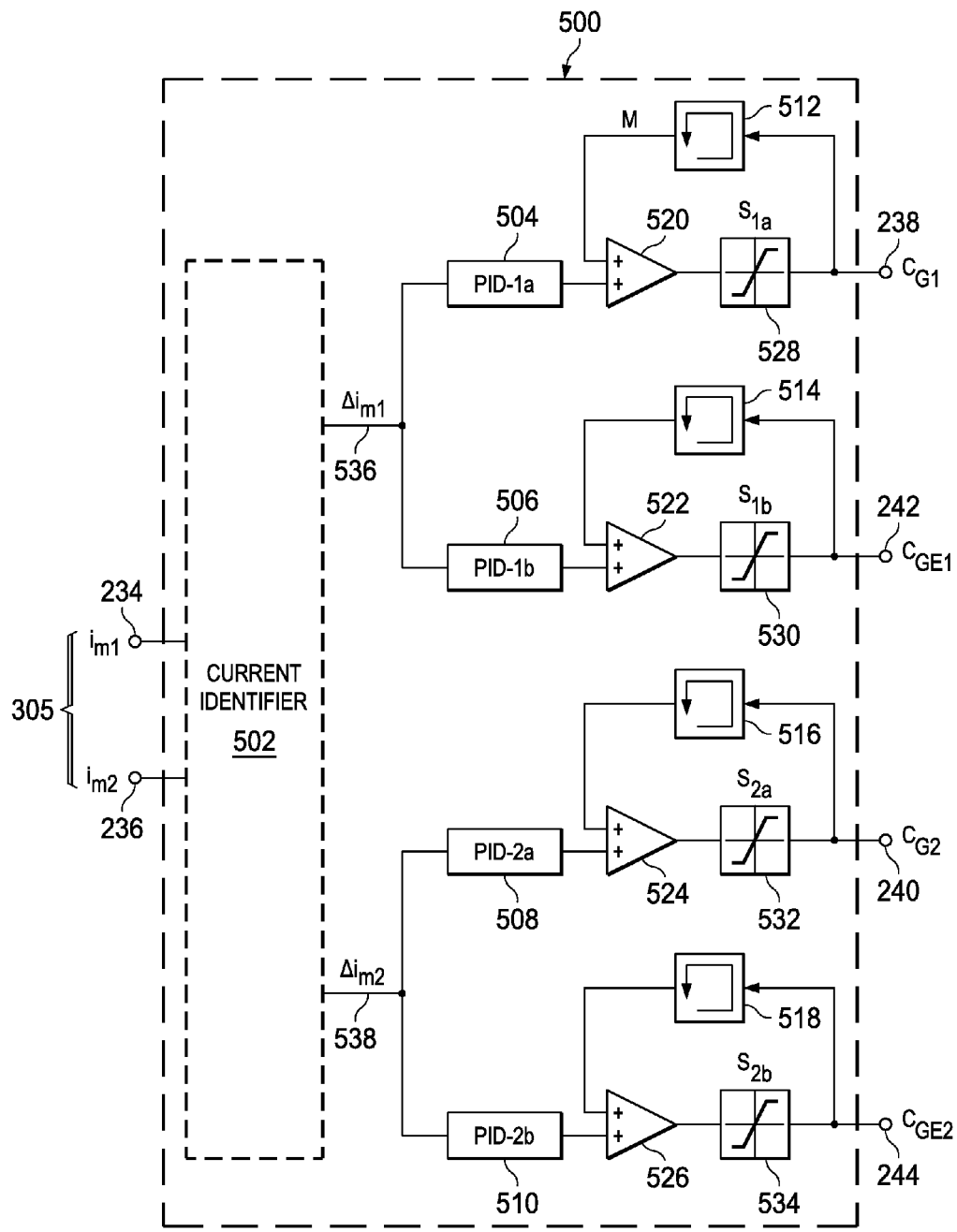
FIG. 5 is an illustration of an implementation for a controller in accordance with an illustrative embodiment.

Turning next to FIG. 5, an illustration of an implementation for a controller is depicted in accordance with an illustrative embodiment. Controller 500 is an example of one implementation for controller 104 shown in block form in FIG. 1 and controller 208 in FIG. 2.

In this illustrative example, controller 500 includes a number of different components. As depicted, controller 500 includes current identifier 502, proportional integral derivative unit 504, proportional integral derivative unit 506, proportional integral derivative unit 508, proportional integral derivative unit 510, delay 512, delay 514, delay 516, delay 518, amplifier 520, amplifier 522, amplifier 524, amplifier 526, limiter 528, limiter 530, limiter 532, and limiter 534.

Current identifier 502 is configured to identify an average current $i_{avg}$ from current $i_{m1}$ 234 and current $i_{m2}$ 236. The input into current identifier 502 may be voltage $V_1$ 305, which represents a difference between current $i_{m1}$ 234 and current $i_{m2}$ 236. Additionally, current identifier 502 is configured to identify a difference between current $i_{m1}$ 234 and the average current $i_{avg}$. This difference is output as difference $\Delta i_{m1}$ 536. Additionally, current identifier 502 is configured to identify a difference between current $i_{m2}$ 236 and the average current $i_{avg}$ that is output as difference $\Delta i_{m2}$ 538.

The proportional integral derivative unit may be implemented using any currently available proportional integral derivative controller configured to calculate an error value as a difference between a measured value and a desired value for a particular parameter such as a current. The delays are used as memories to hold the previous values output by controller 500. The limiters are used to provide a limit to the values output by controller 500.

In the illustrative examples, limits may be set according to transistor characteristics. A characteristic may be, for example, the range in which the transistor can be controlled. By setting the limits, controller 500 may operate more effectively in the transistor operation range without losing control of stability. The transistor may also be protected from possible damage.

The illustration of circuit control system 200 and the different components in circuit control system 200 in FIGS. 2-5 are only provided as an example of one illustrative embodiment and not meant to limit the manner in which other illustrative embodiments may be implemented. For example, circuit control system 200 depicts the use of a single drive circuit, control terminal drive circuit 206.

In other illustrative examples, an additional control terminal drive circuit may be used to supply drive current and set drive voltages to the control terminals. For example, control terminal drive circuit 206 may be used to control transistor $t_1$ 202, while the additional control terminal drive circuit may be used to control transistor $t_2$ 204. Additionally, when more than one control terminal drive circuit is used, a synchronization of signals to the control terminal drive circuit may be implemented.

Figure 6:
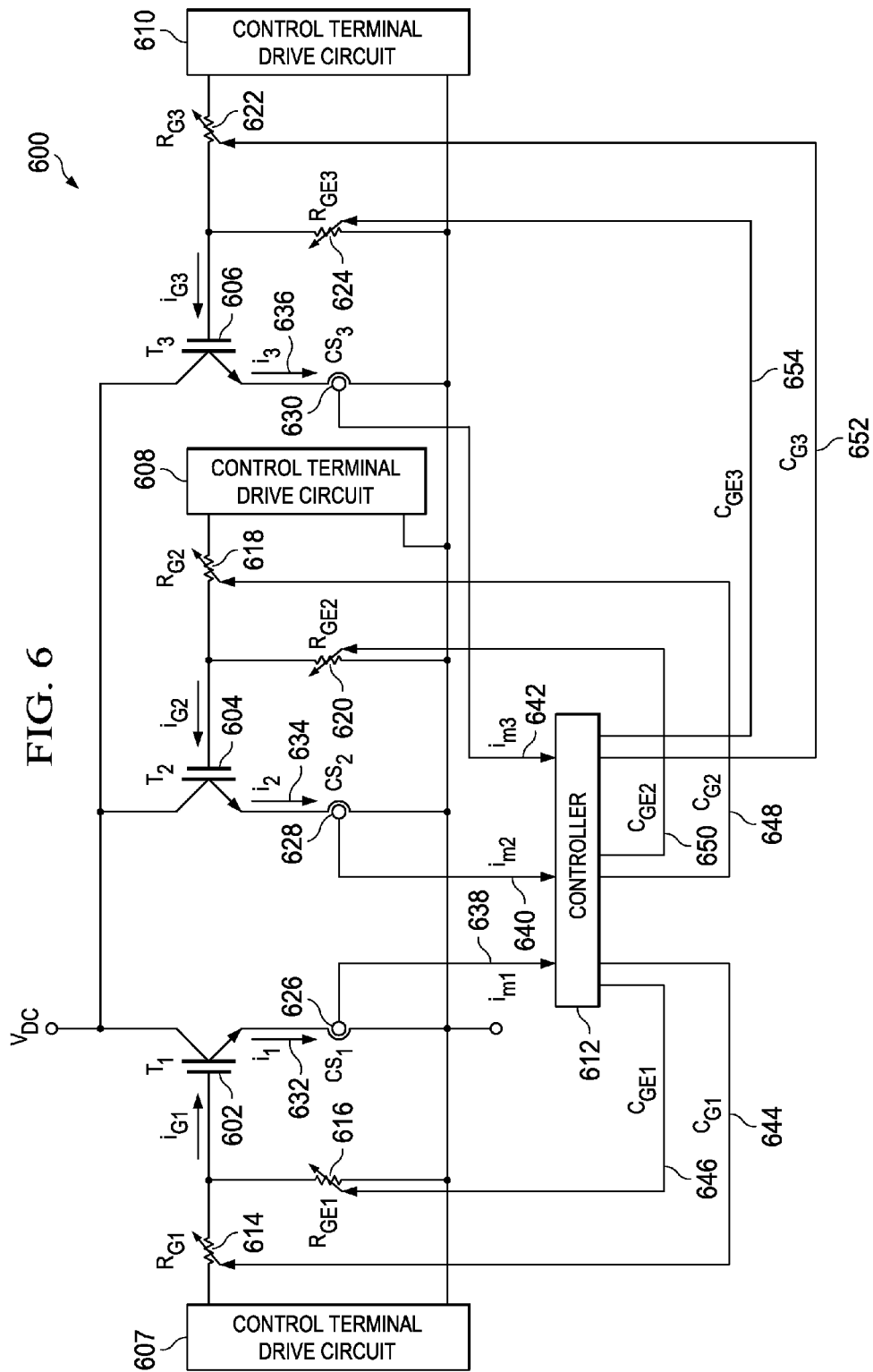
FIG. 6 is another illustration of a circuit control system in accordance with an illustrative embodiment.

With reference next to FIG. 6, another illustration of a circuit control system is depicted in accordance with an illustrative embodiment. In this example, circuit control system 600 is another example of an implementation of circuit control system 100 in FIG. 1.

Circuit control system 600 is another example of a configuration of transistors for which output currents from those transistors may be controlled such that the output currents are substantially the same for each transistor. As depicted, circuit control system 600 includes transistor $t_1$ 602, transistor $t_2$ 604, transistor $t_3$ 606, control terminal drive circuit 607, control terminal drive circuit 608, control terminal drive circuit 610, controller 612, variable resistance device $R_{G1}$ 614, variable resistance device $R_{GE1}$ 616, variable resistance device $R_{G2}$ 618, variable resistance device $R_{GE2}$ 620, variable resistance device $R_{G3}$ 622, variable resistance device $R_{GE3}$ 624, current sensor $CS_1$ 626, current sensor $CS_2$ 628, and current sensor $CS_3$ 630.

In this depicted example, transistor $t_1$ 602, transistor $t_2$ 604, and transistor $t_3$ 606 are connected in parallel. These transistors are examples of transistors 110 shown in block form in FIG. 1. Transistor $t_1$ 602 outputs current $i_1$ 632; transistor $t_2$ 604 outputs current $i_2$ 634; and transistor $t_3$ 606 outputs current $i_3$ 636.

Current sensor $CS_1$ 626 senses current $i_1$ 632 and generates current $i_{m1}$ 638. Current sensor $CS_2$ 628 senses current $i_2$ 634 and generates current $i_{m2}$ 640. Current sensor $CS_3$ 630 senses current $i_3$ 636 and generates current $i_{m3}$ 642. These current sensors are examples of sensors that may be implemented in current sensor system 130 shown in block form in FIG. 1. Further, the currents are examples of currents 112 in FIG. 1.

The levels of the currents generated by the current sensors are used as inputs into controller 612. Controller 612, in turn, identifies an average current from these currents. Additionally, controller 612 identifies a difference between the currents detected and the average current. This difference is used to generate outputs, such as control signal $C_{G1}$ 644, control signal $C_{GE1}$ 646, control signal $C_{G2}$ 648, control signal $C_{GE2}$ 650, control signal $C_{G3}$ 652, and control signal $C_{GE3}$ 654.

These outputs are used to control the variable resistance devices such that the currents output by the transistors are substantially the same. In this illustrative example, the currents output are selected to be substantially equal to the average of current $i_1$ 632, current $i_2$ 634, and current $i_3$ 636.

For example, control signal $C_{G1}$ 644 controls variable resistance device $R_{G1}$ 614; control signal $C_{GE1}$ 646 controls variable resistance device $R_{GE1}$ 616; control signal $C_{G2}$ 648 controls variable resistance device $R_{G2}$ 618; control signal $C_{GE2}$ 650 controls variable resistance device $R_{GE2}$ 620; control signal $C_{G3}$ 652 controls variable resistance device $R_{G3}$ 622; and control signal $C_{GE3}$ 654 controls variable resistance device $R_{GE3}$ 624. In this illustrative example, the variable resistance devices are examples of implementations for variable resistance devices 122 shown in block form in FIG. 1.

Figure 7:
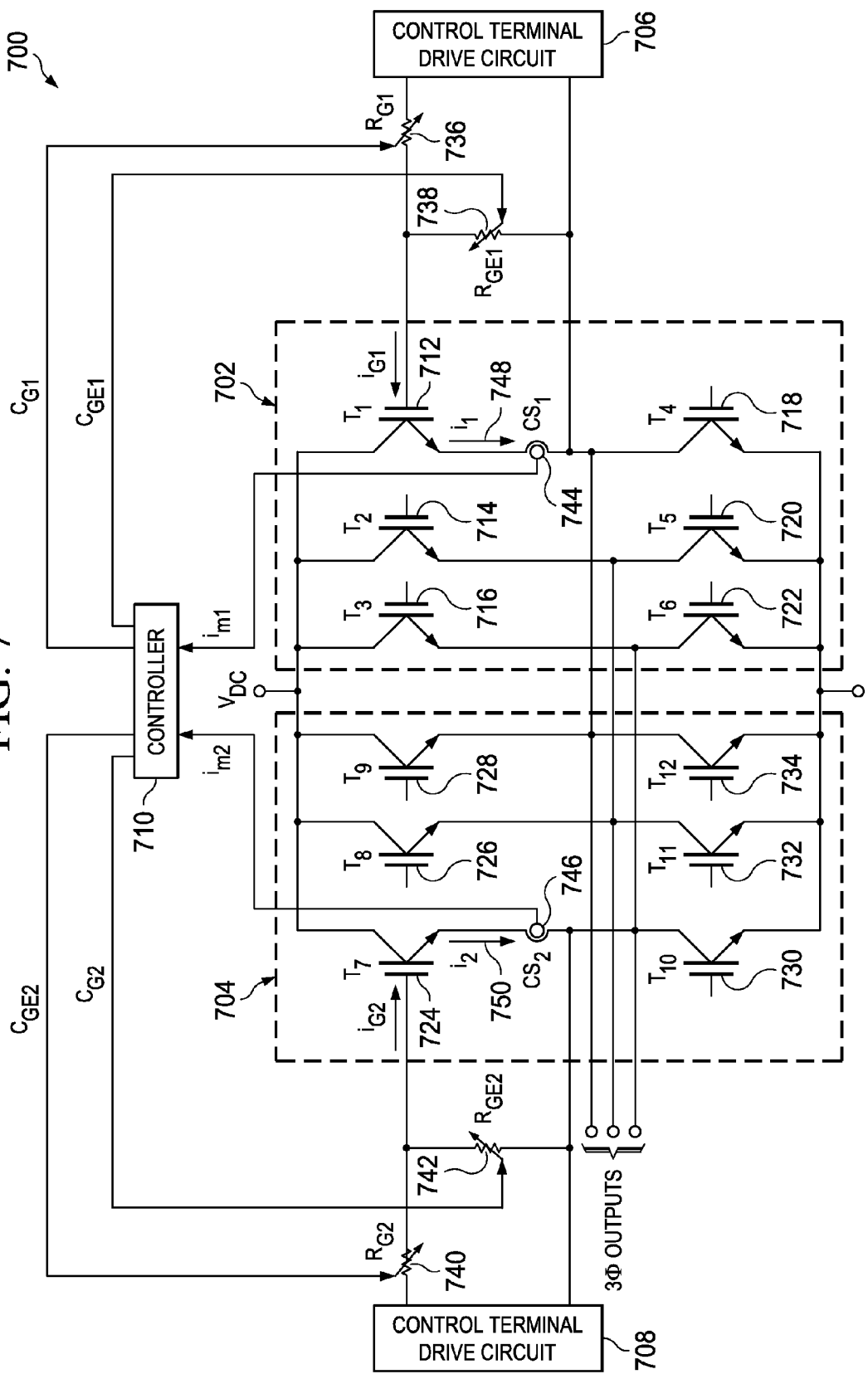
FIG. 7 is an illustration of a circuit control system with inverters in accordance with an illustrative embodiment.

Turning now to FIG. 7, an illustration of a circuit control system with inverters is depicted in accordance with an illustrative embodiment. In this illustrative example, circuit control system 700 includes inverter 702, inverter 704, control terminal drive circuit 706, control terminal drive circuit 708, and controller 710. Inverter 702 and inverter 704 are examples of circuit modules 102 shown in block form in FIG. 1.

Inverter 702 and inverter 704 include transistors that are connected in parallel. In particular, inverter 702 and inverter 704 operate in parallel with each other in this depicted example.

As depicted, inverter 702 includes transistor $t_1$ 712, transistor $t_2$ 714, transistor $t_3$ 716, transistor $t_4$ 718, transistor $t_5$ 720, and transistor $t_6$ 722. Inverter 704 includes transistor $t_7$ 724, transistor $t_8$ 726, transistor $t_9$ 728, transistor $t_{10}$ 730, transistor $t_{11}$ 732, and transistor $t_{12}$ 734.

Control terminal drive circuit 706 is shown connected to transistor $t_1$ 712. Control terminal drive circuit 708 is shown connected to transistor $t_7$ 724. Although not shown, control terminal drive circuit 706 is also connected to transistor $t_2$ 714, transistor $t_3$ 716, transistor $t_4$ 718, transistor $t_5$ 720, and transistor $t_6$ 722. Additionally, control terminal drive circuit 708 is also connected to transistor $t_8$ 726, transistor $t_9$ 728, transistor $t_{10}$ 730, transistor $t_{11}$ 732, and transistor $t_{12}$ 734 although these connections are also not shown.

As depicted, control terminal drive circuit 706 is configured to control variable resistance device $R_{G1}$ 736 and variable resistance device $R_{GE1}$ 738, which are connected to the base of transistor $t_1$ 712. Also depicted are variable resistance device $R_{G2}$ 740 and variable resistance device $R_{GE2}$ 742 connected to the base of transistor $t_2$ 714.

Current sensor $CS_1$ 744 is shown connected to the output of transistor $t_1$ 712 and controller 710. Current sensor $CS_1$ 744 detects current $i_1$ 748 flowing out of the output of transistor $t_1$ 712. Current sensor $CS_2$ 746 is shown connected to the output of transistor $t_2$ 714 and to controller 710. Current sensor $CS_2$ 746 detects current $i_2$ 750.

Other current sensors are present and connected to the other transistors, but not shown in these examples. The other components and connections are omitted in the illustration of this figure to avoid obscuring the illustration of the implementation using inverter 702 and inverter 704.

Figure 8:
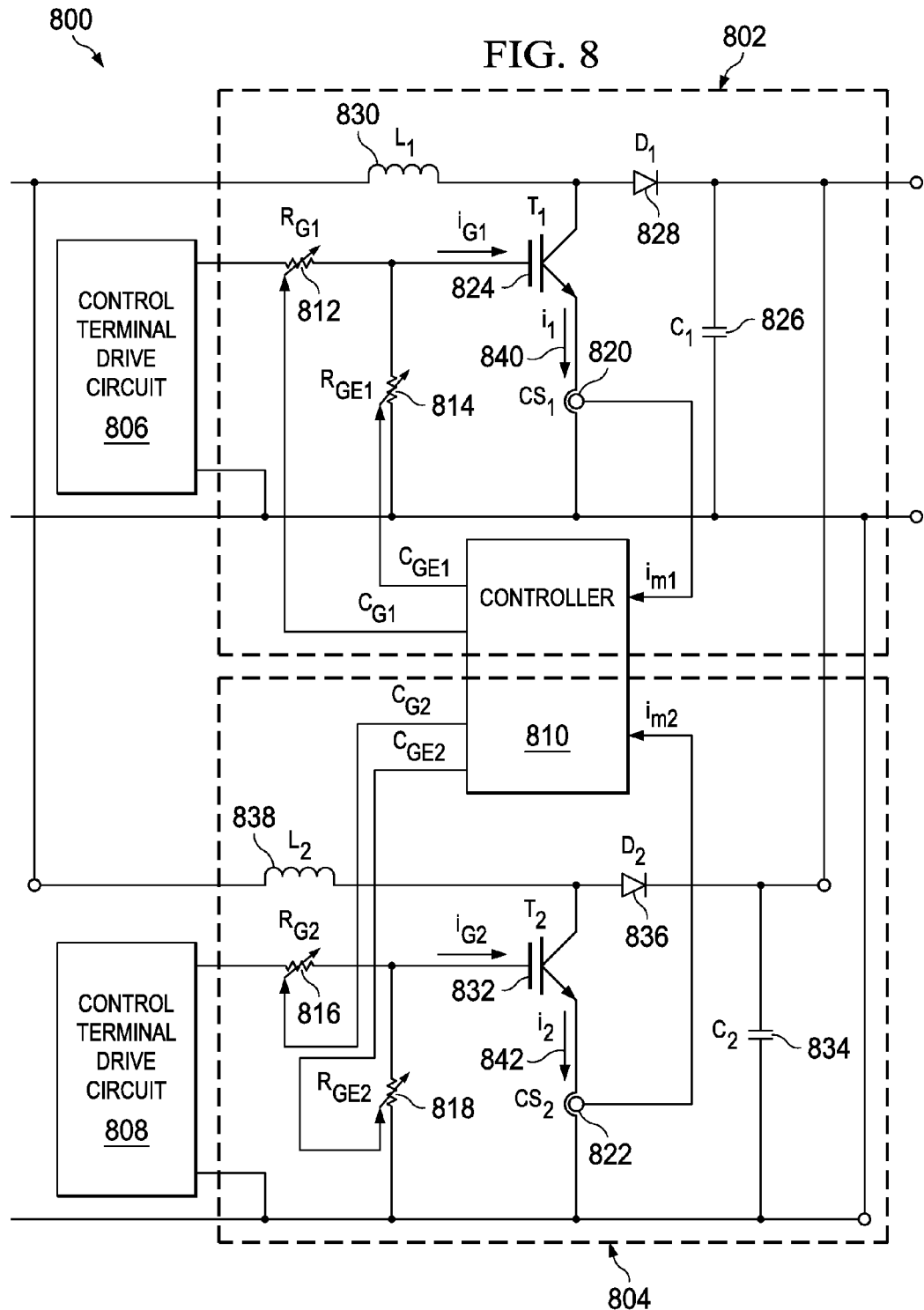
FIG. 8 is an illustration of a circuit control system with direct current to direct current converters in accordance with an illustrative embodiment.

Turning now to FIG. 8, an illustration of a circuit control system with direct current to direct current converters is depicted in accordance with an illustrative embodiment. In this illustrative example, circuit control system 800 includes direct current to direct current converter 802, direct current to direct current converter 804, control terminal drive circuit 806, control terminal drive circuit 808, controller 810, variable resistance device $R_{G1}$ 812, variable resistance device $R_{GE1}$ 814, variable resistance device $R_{G2}$ 816, variable resistance device $R_{GE2}$ 818, current sensor $CS_1$ 820, and current sensor $CS_2$ 822.

Direct current to direct current converter 802 includes transistor $T_1$ 824, capacitor $C_1$ 826, diode $d_1$ 828, and inductor $L_1$ 830. Direct current to direct current converter 804 includes transistor $T_2$ 832, capacitor $C_2$ 834, diode $d_2$ 836, and inductor $L_2$ 838.

Controller 810 is configured to control characteristics of transistor $T_1$ 824 and transistor $T_2$ 832 through the use of variable resistance devices based on sensing current $i_1$ 840 output by transistor $T_1$ 824 and current $i_2$ 842 output by transistor $T_2$ 832. The currents are detected by current sensor $CS_1$ 820 and current sensor $CS_2$ 822 and are used as feedback in the illustrative example.

The illustration of circuit control system 700 in FIG. 7 and circuit control system 800 in FIG. 8 are not meant to limit the manner in which other illustrative examples may be implemented. For example, in other illustrative examples, additional inverters may be present in addition to inverter 702 and inverter 704. Also, additional pairs of direct current to direct current converters may be used. The different illustrative examples may be applied to other types of circuit modules and topologies of circuit modules in which parallel connections of the modules are used.

Figure 9:
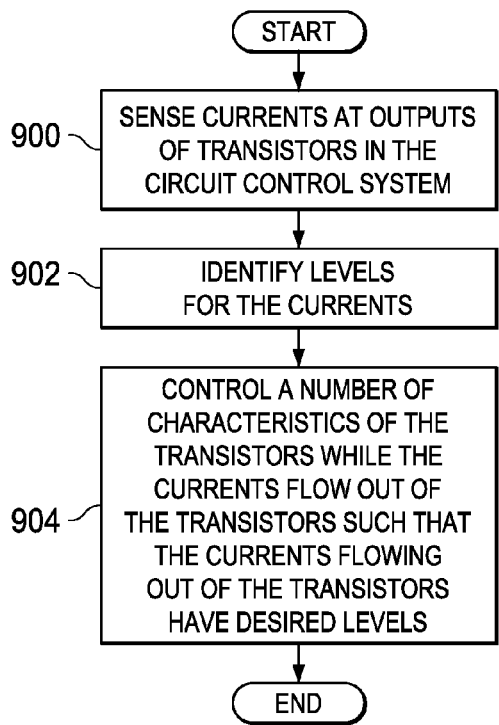
FIG. 9 is an illustration of a flowchart of a process for controlling circuit modules in accordance with an illustrative embodiment.

With reference next to FIG. 9, a flowchart of a process for controlling circuit modules is depicted in accordance with an illustrative embodiment. The process illustrated in FIG. 9 may be implemented in circuit control system 100 in FIG. 1. For example, one or more of the different operations may be implemented in controller 104 in FIG. 1.

The process begins by sensing currents at outputs of transistors in the circuit control system (operation 900). The process identifies levels for the currents (operation 902). The process then controls a number of characteristics of the transistors while the currents flow out of the transistors such that the currents flowing out of the transistors have desired levels (operation 904) with the process terminating thereafter.

Figure 10:
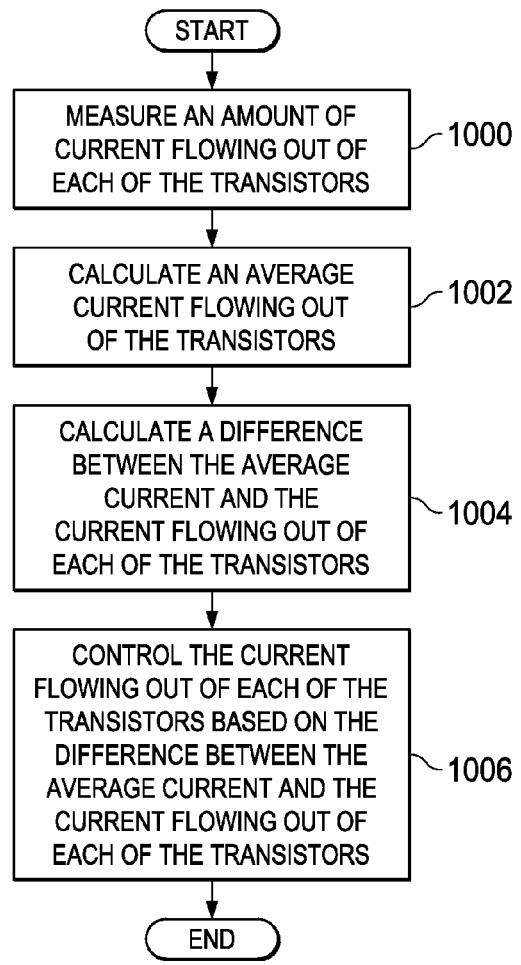
FIG. 10 is an illustration of a flowchart of a process for controlling current in circuit modules in accordance with an illustrative embodiment.

With reference next to FIG. 10, an illustration of a flowchart of a process for controlling current in circuit modules is depicted in accordance with an illustrative embodiment. The process illustrated in FIG. 10 is a more detailed illustration of operations that may be performed by controller 104 to control currents 112 at outputs 132 in transistors 110 in circuit modules 102.

The process begins by measuring an amount of current flowing out of each of the transistors (operation 1000). These transistors may be located in one or more circuit modules depending on the particular implementation. The current flowing out of each of the transistors may be measured by current sensor system 130 in FIG. 1. The transistors are connected in parallel in this illustrative example.

The process then calculates an average current flowing out of the transistors (operation 1002). In other words, an average of the currents measured for the transistors is taken. The process also calculates a difference between the average current and the current flowing out of each of the transistors (operation 1004). For example, the difference between the average current and the current flowing out of each of the transistors may be identified using a current transformer. The average current is a level of current with desired levels, such as desired levels 116 in FIG. 1.

The process then controls the current flowing out of each of the transistors based on the difference between the average current and the current flowing out of each of the transistors (operation 1006), with the process then returning to operation 1000. In the illustrative example, the current flowing out of each transistor may be controlled using variable resistance devices. The variable resistance devices are controlled such that the currents flowing out of the transistors move towards or are substantially equal to the average current.

Figure 11:
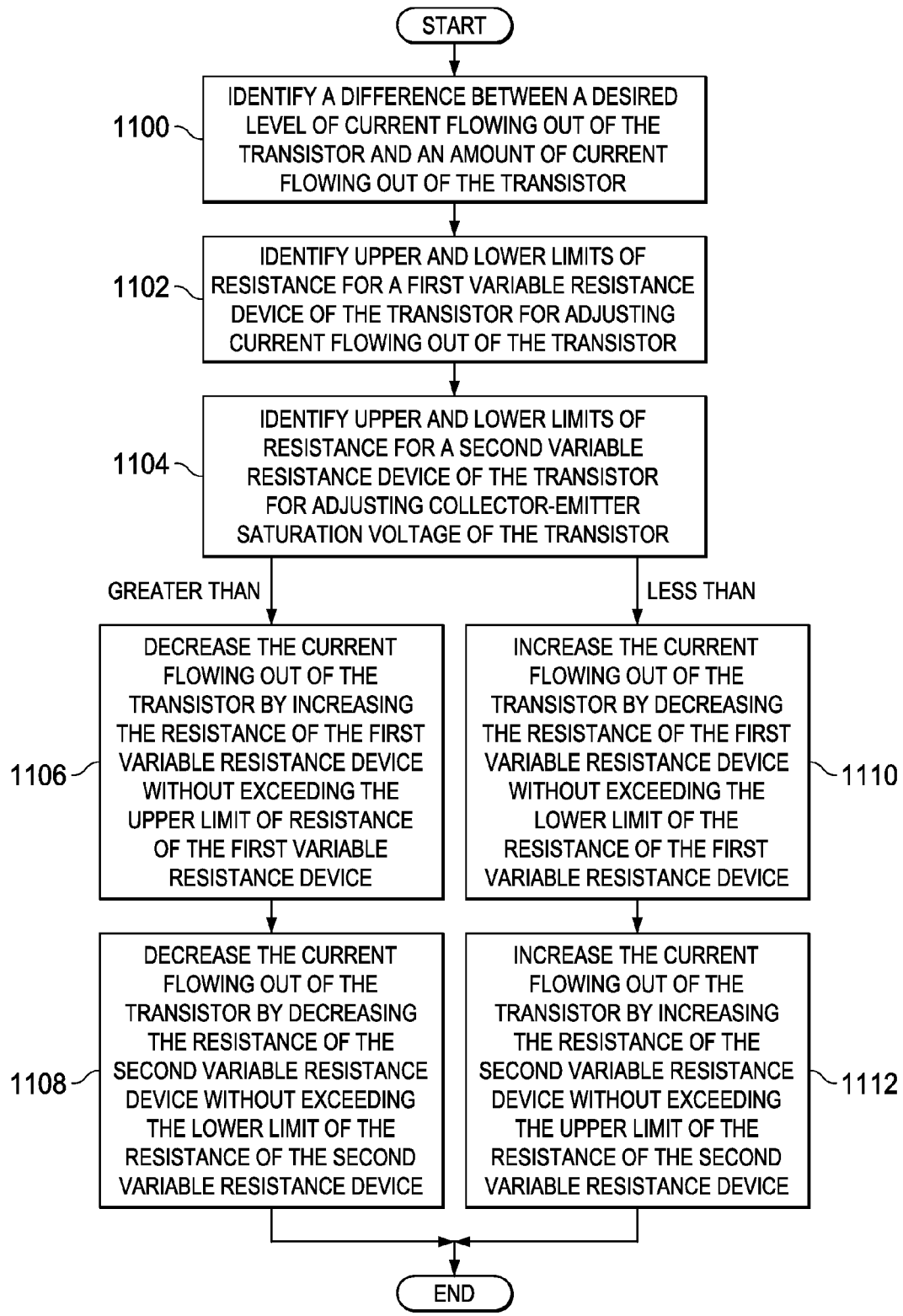
FIG. 11 is an illustration of a flowchart of a process for controlling current flowing out of a transistor in accordance with an illustrative embodiment.

With reference now to FIG. 11, an illustration of a flowchart of a process for controlling current flowing out of a transistor is depicted in accordance with an illustrative embodiment. The process illustrated in FIG. 11 is an example of an implementation for operation 1006 in FIG. 10. The different operations illustrated in this figure may be performed for each of the transistors that are being controlled in the circuit control system.

The process begins by identifying a difference between a desired level of current flowing out of the transistor and an amount of current flowing out of the transistor (operation 1100). The desired level for the current output by the transistor may be the average current output by the transistors in this illustrative example. In other illustrative examples, the desired levels may be selected based on other factors such as the total amount of current that is desired for a circuit module or a group of circuit modules.

The process then identifies upper and lower limits of resistance for a first variable resistance device of the transistor for adjusting current flowing out of the transistor (operation 1102). The process also identifies upper and lower limits of resistance for a second variable resistance device of the transistor for adjusting collector-emitter saturation voltage of the transistor (operation 1104).

As depicted by operation 1106, when the level of the current flowing out of the transistor is greater than the desired level of current, the process decreases the current flowing out of the transistor by increasing the resistance of the first variable resistance device without exceeding the upper limit of resistance of the first variable resistance device (operation 1106). The process then decreases the current flowing out of the transistor by decreasing the resistance of the second variable resistance device without exceeding the lower limit of the resistance of the second variable resistance device (operation 1108), with the process terminating thereafter.

As depicted by operation 1110, when the amount of current flowing out of the transistor is less than the desired level of current flowing, the process increases the current flowing out of the transistor by decreasing the resistance of the first variable resistance device without exceeding the lower limit of the resistance of the first variable resistance device (operation 1110). The process then increases the current flowing out of the transistor by increasing the resistance of the second variable resistance device without exceeding the upper limit of the resistance of the second variable resistance device (operation 1112), with the process terminating thereafter.

Figure 12B:
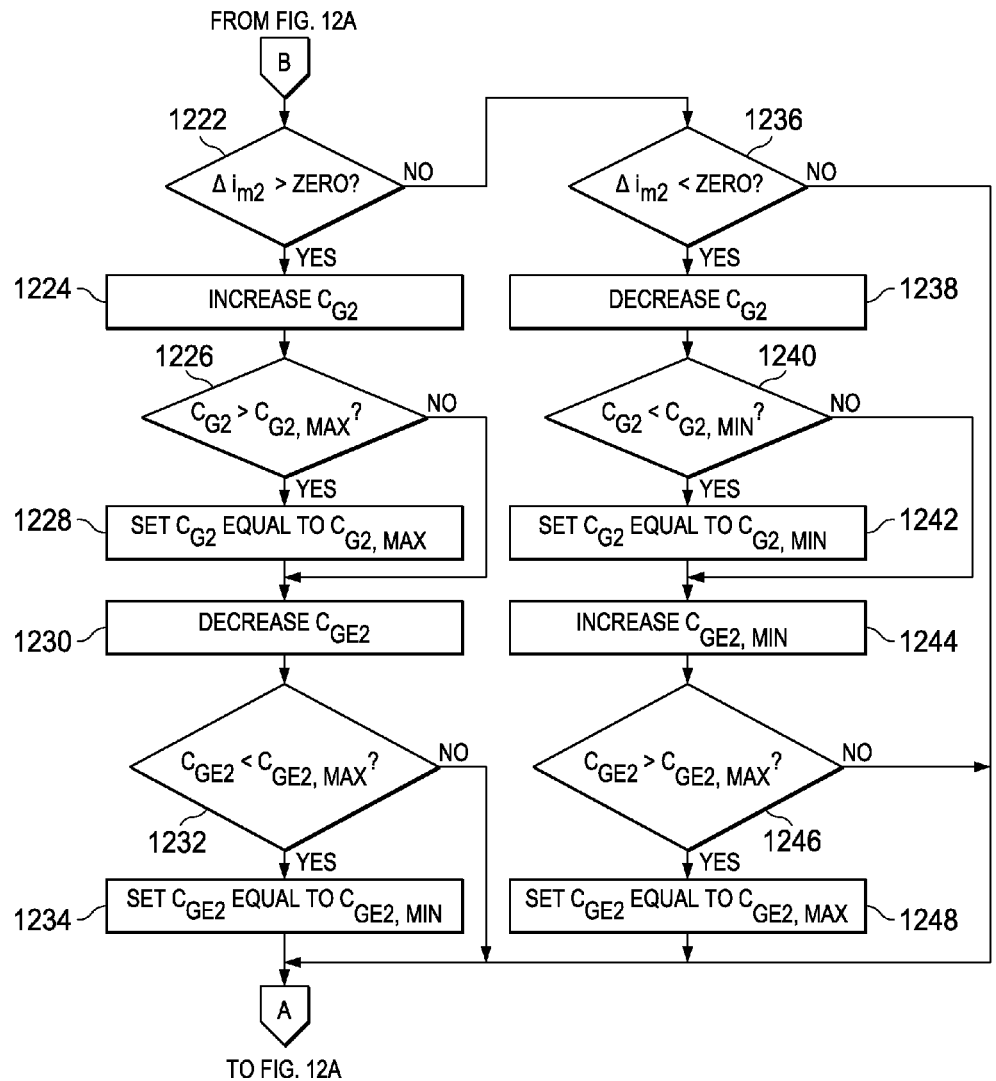

Turning now to FIGS. 12A and 12B, illustrations of a flowchart of a process for controlling the operation of transistors in a circuit control system are depicted in accordance with an illustrative embodiment. The different operations illustrated in this figure may be implemented in circuit control system 200 in FIG. 2. In particular, one or more of the operations may be performed by controller 208 in FIG.

2. The different components and control signals referred to in the description of this flowchart are with reference to the corresponding components and control signals in circuit control system 200.

The process begins by identifying upper and lower limit values for control signal $C_{G1}$, control signal $C_{GE1}$, control signal $C_{G2}$, and control signal $C_{GE2}$ (operation 1200). These limits are limits to the control signals that may be sent to variable resistance devices in circuit control system 200.

In the illustrative example, maximum values are identified representing these limits. These maximum values include $C_{G1}$ max as a maximum value control signal for control signal $C_{G1}$ 238; $C_{GE1}$ max as a maximum value for control signal $C_{GE1}$ 242; $C_{G2}$ max as a maximum value for control signal $C_{G2}$ 240; and $C_{GE2}$ max as a maximum value for control signal $C_{GE2}$ 244 in FIG. 2. The limits also include minimum values. These minimum values include $C_{G1}$ min as a minimum value for control signal $C_{G1}$ 238; $C_{GE1}$ min as a minimum value for control signal $C_{GE1}$ 242; $C_{G2}$ min as a minimum value for control signal $C_{G2}$ 240; and $C_{GE2}$ min as a minimum value for control signal $C_{GE2}$ 244.

In the illustrative examples, the maximum and minimum values for the control signals may be selected based on the maximum and minimum resistance that may be generated by the variable resistance devices. For example, $C_{GE1}$ max may be set as a maximum resistance value that variable resistance device $R_{G1}$ 210 in FIG. 2 may provide. As another illustrative example, $C_{GE2}$ min may be set based on the minimum resistance that can be provided by variable resistance device $R_{G2}$ 214 in FIG. 2.

The process then identifies current $i_{m1}$ and current $i_{m2}$ (operation 1202). These currents may be measured using current sensors and represent current $i_1$ 230 and current $i_2$ 232 in FIG. 2 output by the transistors.

The process then calculates an average current $i_{avg}$ from the measured currents output by the transistors (operation 1204). As depicted, the average current $i_{avg}$ may be calculated as follows:

$$i_{avg}=(i_{m1}+i_{m2})/2$$

The averaging of the currents may be used to identify when one of the measured currents is higher or lower than the average current.

The process also calculates the difference between average current $i_{avg}$ and the measured currents output by the transistors (operation 1206). These differences may be measured currents and may be calculated as follows:

$$\Delta i_{m1}=i_{m1}-i_{avg}$$

$$\Delta i_{m2}=i_{m2}-i_{avg}$$

Difference $\Delta i_{m1}$ 234 and difference $\Delta i_{m2}$ 236 in FIG. 2 represent the difference between the measured current and the average current. These differences represent error values in the illustrative example. These error values are used as feedback by the controller to adjust the currents output by the transistors.

Next, a determination is made as to whether difference $\Delta i_{m1}$ is greater than zero (operation 1208). If difference $\Delta i_{m1}$ is greater than zero, current $i_1$ is greater than current $i_2$ and the process increases control signal $C_{G1}$ (operation 1210).

A determination is then made as to whether control signal $C_{G1}$ is greater than $C_{G1}$ max (operation 1212). If control signal $C_{G1}$ is not greater than $C_{G1}$ max, control signal $C_{G1}$ is set equal to $C_{G1}$ max (operation 1214).

The process then decreases control signal $C_{GE1}$ (operation 1216). The process also proceeds to operation 1216 if control signal $C_{G1}$ is greater than $C_{G1}$ max in operation 1212. In this operation, decreasing control signal $C_{GE1}$ reduces the current applied to the base and the voltage across the base of the transistor.

A determination is then made as to whether control signal $C_{GE1}$ is less than $C_{GE1}$ min (operation 1218). If control signal $C_{GE1}$ is less than $C_{GE1}$ min, control signal $C_{GE1}$ is set to $C_{GE1}$ min (operation 1220).

A determination is then made as to whether difference $\Delta i_{m2}$ is greater than zero (operation 1222). The determination in operation 1222 is also made after operation 1218 if control signal $C_{GE1}$ is not less than $C_{GE1}$ min.

If difference $\Delta i_{m2}$ is greater than zero, current $i_1$ is greater than current $i_2$ and the process increases control signal $C_{G2}$ (operation 1224). In this operation, increasing control signal $C_{G2}$ decreases the current applied to the base and the voltage across the base of the transistor. Next, a determination is made as to whether control signal $C_{G2}$ is greater than $C_{G2}$ max (operation 1226). If control signal $C_{G2}$ is greater than $C_{G2}$ max, control signal $C_{G2}$ is set equal to $C_{G2}$ max (operation 1228).

The process then decreases control signal $C_{GE2}$ (operation 1230). The process also proceeds to operation 1230 from operation 1226 if control signal $C_{G2}$ is not greater than $C_{G2}$ max. Next, a determination is made as to when control signal $C_{GE2}$ is less than $C_{GE2}$ min (operation 1232).

If control signal $C_{GE2}$ is less than $C_{GE2}$ min, the process sets control signal $C_{GE2}$ equal to $C_{GE2}$ min (operation 1234), with the process then returning to operation 1202 to receive measurements of the currents output by the transistors. The process also proceeds to operation 1202 from operation 1232 if control signal $C_{GE2}$ is not less than $C_{GE2}$ min.

With reference again to operation 1222, if difference $\Delta i_{m2}$ is not greater than zero, a determination is made as to whether difference $\Delta i_{m2}$ is less than zero (operation 1236). If difference $\Delta i_{m2}$ is not less than zero, current $i_1$ is equal to current $i_2$ and the process returns to operation 1202. Otherwise, current $i_1$ is less than current $i_2$ and the process decreases control signal $C_{G2}$ (operation 1238). In this case, current $i_1$ is less than current $i_2$. In operation 1238, decreasing control signal $C_{G2}$ increases the current to the base and the voltage across the base of the transistor.

A determination is made as to whether control signal $C_{G2}$ is less than $C_{G2}$ min (operation 1240). If control signal $C_{G2}$ is less than $C_{G2}$ min, the process sets control signal $C_{G2}$ equal to $C_{G2}$ min (operation 1242). Thereafter, the process increases control signal $C_{GE2}$ (operation 1244). The process also proceeds to operation 1244 from operation 1240 if control signal $C_{G2}$ is not less than $C_{G2}$ min. In operation 1244, the increase in control signal $C_{GE2}$ increases the current applied to the base and the voltage across the base of the transistor.

A determination is then made as to whether control signal $C_{GE2}$ is greater than $C_{GE2}$ max (operation 1246). If control signal $C_{GE2}$ is greater than $C_{GE2}$ max, control signal $C_{GE2}$ is set equal to $C_{GE2}$ max (operation 1248). The process then returns to operation 1202 as described above. The process also proceeds to operation 1202 from operation 1246 if control signal $C_{GE2}$ is not greater than $C_{GE2}$ max.

With reference again to operation 1208, if difference $\Delta i_{m1}$ is not greater than zero, a determination is made as to whether difference $\Delta i_{m1}$ is less than zero (operation 1250). If difference $\Delta i_{m1}$ is not less than zero, current $i_1$ is equal to current $i_2$ and the process returns to operation 1202 as described above.

Otherwise, the process decreases control signal $C_{G1}$ (operation 1252). Decreasing control signal $C_{G1}$ results in an increase in the current applied to the base and the voltage across the base of the transistor.

Next, a determination is made as to whether control signal $C_{G1}$ is less than $C_{G1}$ min (operation 1254). If control signal $C_{G1}$ is less than $C_{G1}$ min, the process sets control signal $C_{G1}$ equal to $C_{G1}$ min (operation 1256). The process then increases control signal $C_{GE1}$ (operation 1258). The process also proceeds to operation 1258 from operation 1254 if control signal $C_{G1}$ is less than $C_{G1}$ min.

A determination is then made as to whether control signal $C_{GE1}$ is greater than $C_{GE1}$ max (operation 1260). If control signal $C_{GE1}$ is greater than $C_{GE1}$ max, the process sets control signal $C_{GE1}$ equal to $C_{GE1}$ max (operation 1262), with process then proceeding to operation 1222. The process also proceeds to operation 1222 from operation 1260 if control signal $C_{GE1}$ is greater than $C_{GE1}$ max.

In operation 1210, operation 1252, operation 1224, and operation 1238, changes are made to control signals that increase or decrease the control signals. The changes may be made in a number of different ways. For example, a constant step increase or decrease may be used. In another example, a variable step increase and decrease may be used. With this type of change, each adjustment may be variable based on a factor such as $\Delta i_{m1}$ 536 and $\Delta i_{m2}$ 538 in FIG. 5. In still another example, a look-up table may be used to identify the increase or decrease. Of course, still other approaches involving advanced searching, iteration, or other techniques may be used.

Also, the operations in FIGS. 12A and 12B are described with reference to bipolar transistors. When other types of transistors are used, the control signals are used to control current and voltages applied to other forms of control terminals other than bases. For example, if field effect transistors are used, the currents and voltages to gates are controlled using the operations described above.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Illustrative embodiments of the disclosure may be described in the context of aircraft manufacturing and service method 1300 as shown in FIG. 13 and aircraft 1400 as shown in FIG. 14. Turning first to FIG. 13, an illustration of an aircraft manufacturing and service method is depicted in the form of a block diagram in accordance with an illustrative embodiment. During pre-production, aircraft manufacturing and service method 1300 may include specification and design 1302 of aircraft 1400 in FIG. 14 and material procurement 1304.

During production, component and subassembly manufacturing 1306 and system integration 1308 of aircraft 1400 in FIG. 14 takes place. Thereafter, aircraft 1400 in FIG. 14 may go through certification and delivery 1310 in order to be placed in service 1312. While in service 1312 by a customer, aircraft 1400 in FIG. 14 is scheduled for routine maintenance and service 1314, which may include modification, reconfiguration, refurbishment, and other maintenance or service.

Each of the processes of aircraft manufacturing and service method 1300 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 14, an illustration of an aircraft is depicted in the form of a block diagram in which an illustrative embodiment may be implemented. In this example, aircraft 1400 is produced by aircraft manufacturing and service method 1300 in FIG. 13 and may include airframe 1402 with plurality of systems 1404 and interior 1406. Examples of systems 1404 include one or more of propulsion system 1408, electrical system 1410, hydraulic system 1412, and environmental system 1414. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1300 in FIG. 13.

In one illustrative example, components or subassemblies produced in component and subassembly manufacturing 1306 in FIG. 13 may be fabricated or manufactured in a manner similar to components or subassemblies produced while aircraft 1400 is in service 1312 in FIG. 13. For example, circuit control systems such as circuit control system 100 may be manufactured and produced in these different operations in aircraft manufacturing and service method 1300. As yet another example, one or more apparatus embodiments, method embodiments, or a combination thereof may be utilized during production stages, such as component and subassembly manufacturing 1306 and system integration 1308 in FIG. 13.

One or more apparatus embodiments, method embodiments, or a combination thereof may be utilized while aircraft 1400 is in service 1312 and/or during maintenance and service 1314 in FIG. 13. Using circuit control systems in accordance with an illustrative embodiment may be provide reduced maintenance and desired levels of current generation for different components in aircraft 1400 while aircraft 1400 is in service 1312. Circuit control systems may be added or replaced while aircraft 1400 is in maintenance and service 1314. The use of a number of the different illustrative embodiments may substantially expedite the assembly of and/or reduce the cost of aircraft 1400.

Thus, one or more of the illustrative embodiments provide a method and apparatus for controlling circuit control systems. In the illustrative examples, transistors connected in parallel and circuit modules connected in parallel may be controlled to provide desired levels of current from the different components. As a result, current sharing between transistors, circuit modules, or both may be set in a manner that reduces overheating, circulation currents, changes in ratings of circuit modules, and undesired operation of circuit modules.

In this manner, increases in the efficiency of the circuit modules and reduced cooling needs may occur. Further, more compact designs of circuit modules may be achieved because adherence to currently used methods for matching components may be reduced.

Additionally, the illustrative examples control the characteristics of the transistors to control the output of currents during the operation of the circuits. This control may occur in both the dynamic current region and the steady state current region for transistors. Further, the illustrative examples also may control characteristics of the transistors dynamically to take into account differences in heating and other conditions that may result in the parameters of the transistors varying differently between different transistors.

In the illustrative examples, both the current applied to a control terminal and the voltage across the control terminal may be controlled. In this manner, the current output by the transistors in current sharing may be set in a desired manner.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
   a controller configured to:
   identify currents flowing out of transistors;
   identify an average current for the currents flowing out of the transistors;
   identify a difference between the currents and the average current; and
   control a number of characteristics of the transistors using the difference between the currents and the average current while the currents flow out of the transistors such that the currents flowing out of the transistors have desired levels, wherein the number of characteristics includes at least a limit on a range of currents in which the transistors can be controlled and also one of a dynamic state current region or steady state current region for the transistors.

2. The apparatus of claim 1 further comprising:
   a number of circuit modules, wherein the transistors are located in the number of circuit modules.

3. The apparatus of claim 2, wherein the number of circuit modules is connected in parallel.

4. The apparatus of claim 2, wherein the number of circuit modules is selected from at least one of a power module, an inverter, a direct current to direct current converter, or an alternating current to direct current converter.

5. The apparatus of claim 2, wherein a portion of the transistors are connected in parallel.

6. The apparatus of claim 1, wherein the number of characteristics is selected from at least one of a voltage for a control terminal of a transistor in the transistors or a current applied to the control terminal.

7. The apparatus of claim 1, wherein the controller is configured to control variable resistance devices in controlling the number of characteristics of the transistors while the currents flow out of the transistors such that the currents flowing out of the transistors have the desired levels.

8. The apparatus of claim 7, wherein the variable resistance devices are selected from at least one of a variable resistor, a current controlled variable resistance device, an optical controlled variable resistance device, a transistor, a bipolar junction transistor, a field effect transistor, a metal-oxide semiconductor field effect transistor, or an insulated gate bipolar transistor.

9. The apparatus of claim 1 wherein the controller is configured to identify levels of the currents flowing out of the transistors using a current sensor system.

10. The apparatus of claim 9, wherein the current sensor system comprises a current transformer connected to outputs of the transistors and configured to indicate a difference between the levels of the currents.

11. A circuit control system comprising:
    a number of circuit modules including transistors connected in parallel;
    variable resistance devices connected to control terminals of the transistors;
    a current sensor system to sense currents at outputs of the transistors; and
    a controller configured to:
    identify levels of the currents flowing out of the transistors from the current sensor system;
       identify an average current level for the levels of the currents flowing out of the transistors;
       identify a difference between the levels of current and the average current level; and
       control a number of characteristics of the transistors using the difference between the current levels and the average current by controlling the variable resistance devices while the currents flow out of the transistors such that the currents flowing out of the transistors have desired levels, wherein the number of characteristics includes at least a limit on a range of currents in which the transistors can be controlled and also one of a dynamic state current region or steady state current region for the transistors.

12. The circuit control system of claim 11, wherein the number of characteristics is selected from at least one of a voltage for a control terminal of a transistor in the transistors or a current applied to the control terminal.

13. The circuit control system of claim 11, wherein the variable resistance devices are selected from at least one of a current controlled variable resistance device, an optical controlled variable resistance device, a variable resistor, a transistor, a bipolar junction transistor, a field effect transistor, a metal-oxide semiconductor field effect transistor, or an insulated gate bipolar transistor.

14. The circuit control system of claim 11, wherein the number of circuit modules is selected from at least one of a power module, an inverter, a direct current to direct current converter, or an alternating current to direct current converter.

15. The circuit control system of claim 11, wherein the current sensor system comprises a current transformer connected to the outputs of the transistors and configured to indicate a difference between the currents.

16. A method for controlling a circuit control system, the method comprising:

sensing currents at outputs of transistors in the circuit control system;
identifying levels for the currents;
identifying an average current level for the levels of the currents;
identifying a difference between the levels of the current and the average current level; and
controlling a number of characteristics of the transistors using the difference between the current levels and the average current while the currents flow out of the transistors such that the currents flowing out of the transistors have desired levels, wherein the number of characteristics includes at least a limit on a range of currents in which the transistors can be controlled and also one of a dynamic state current region or steady state current region for the transistors.

17. The method of claim 16, wherein the sensing step comprises:
sensing the currents at the outputs of the transistors with a current sensor system.

18. The method of claim 16, wherein the controlling step comprises:
controlling variable resistance devices connected to control terminals of the transistors to control the number of characteristics of the transistors while the currents flow out of the transistors such that the currents flowing out of the transistors have the desired levels.

19. The method of claim 18, wherein the variable resistance devices are selected from at least one of a current controlled variable resistance device, an optical controlled variable resistance device, a variable resistor, a transistor, a bipolar junction transistor, a field effect transistor, a metal-oxide semiconductor field effect transistor, or an insulated gate bipolar transistor.

20. The method of claim 16, wherein the transistors are located in a number of circuit modules in the circuit control system.

* * * * *